US012687511B2

(12) United States Patent (10) Patent No.: US 12,687,511 B2
Okamoto (45) Date of Patent: Jul. 21, 2026

(54) ELECTRONIC DEVICE

(71) Applicant: FANUC CORPORATION, Yamanashi (JP)

(72) Inventor: Jun Okamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 340 days.

(21) Appl. No.: 18/264,575

(22) PCT Filed: Apr. 20, 2021

(86) PCT No.: PCT/JP2021/016008
§ 371 (c)(1),
(2) Date: Aug. 7, 2023

(87) PCT Pub. No.: WO2022/224341
PCT Pub. Date: Oct. 27, 2022

(65) Prior Publication Data
US 2024/0053285 A1 Feb. 15, 2024

(51) Int. Cl.
*G01N 25/18* (2006.01)
*H10W 40/00* (2026.01)
(Continued)

(52) U.S. Cl.
CPC ............ *G01N 25/18* (2013.01); *H10W 40/00* (2026.01); *H10W 40/22* (2026.01); *H10W 90/736* (2026.01)

(58) Field of Classification Search
CPC ...... G01N 25/18; H10W 40/00; H10W 40/22; H10W 40/43; H10W 90/736
See application file for complete search history.

(56) References Cited

U.S. PATENT DOCUMENTS

2009/0281761 A1 * 11/2009 Bandholz ................ G06F 11/30
702/132
2010/0150202 A1 * 6/2010 Asano ...................... G01K 7/01
374/102
(Continued)

FOREIGN PATENT DOCUMENTS

JP H11220078 A * 8/1999 ............. G01N 25/18
JP H11-262241 A 9/1999
(Continued)

OTHER PUBLICATIONS

International Search Report issued in PCT/JP2021/016008; mailed Jul. 13, 2021.

*Primary Examiner* — Mirellys Jagan
(74) *Attorney, Agent, or Firm* — Studebaker Brackett PLLC

(57) ABSTRACT

An electronic device according to one embodiment of the present disclosure is capable of continuously ensuring heat conduction by a heat conductive connection body and comprises: a semiconductor element; a heat dissipation member; a heat conductive connection body for connecting the semiconductor element and the heat dissipation member to each other in a heat conductive manner; a power detection unit for detecting power consumption of the semiconductor element; an element temperature detection unit for detecting the temperature of the semiconductor element; an ambient temperature detection unit for detecting the ambient temperature of the heat dissipation member; and a heat resistance calculation unit for calculating heat resistance of the heat conductive connection body on the basis of a detection value of the power detection unit, a detection value of the element temperature detection unit, and a detection value of the ambient temperature detection unit.

5 Claims, 1 Drawing Sheet

(51) Int. Cl.
    *H10W 40/22*       (2026.01)
    *H10W 90/00*       (2026.01)

(56)           References Cited

U.S. PATENT DOCUMENTS

| | | | | |
|---|---|---|---|---|
| 2014/0247857 | A1* | 9/2014 | Han | G01R 31/2874 |
| | | | | 374/57 |
| 2015/0003492 | A1* | 1/2015 | Miyanagi | G01R 31/2619 |
| | | | | 374/44 |
| 2016/0091234 | A1* | 3/2016 | Momose | G06F 1/20 |
| | | | | 62/129 |

FOREIGN PATENT DOCUMENTS

| | | | | |
|---|---|---|---|---|
| JP | 2006-121051 | A | | 5/2006 |
| JP | 2011-253887 | A | | 12/2011 |
| JP | 2016-072473 | A | | 5/2016 |
| JP | 2016-103607 | A | | 6/2016 |
| JP | 6656501 | B1 | | 3/2020 |
| JP | 2022164131 | A | * | 10/2022 |
| WO | 2018/229849 | A1 | | 12/2018 |

* cited by examiner

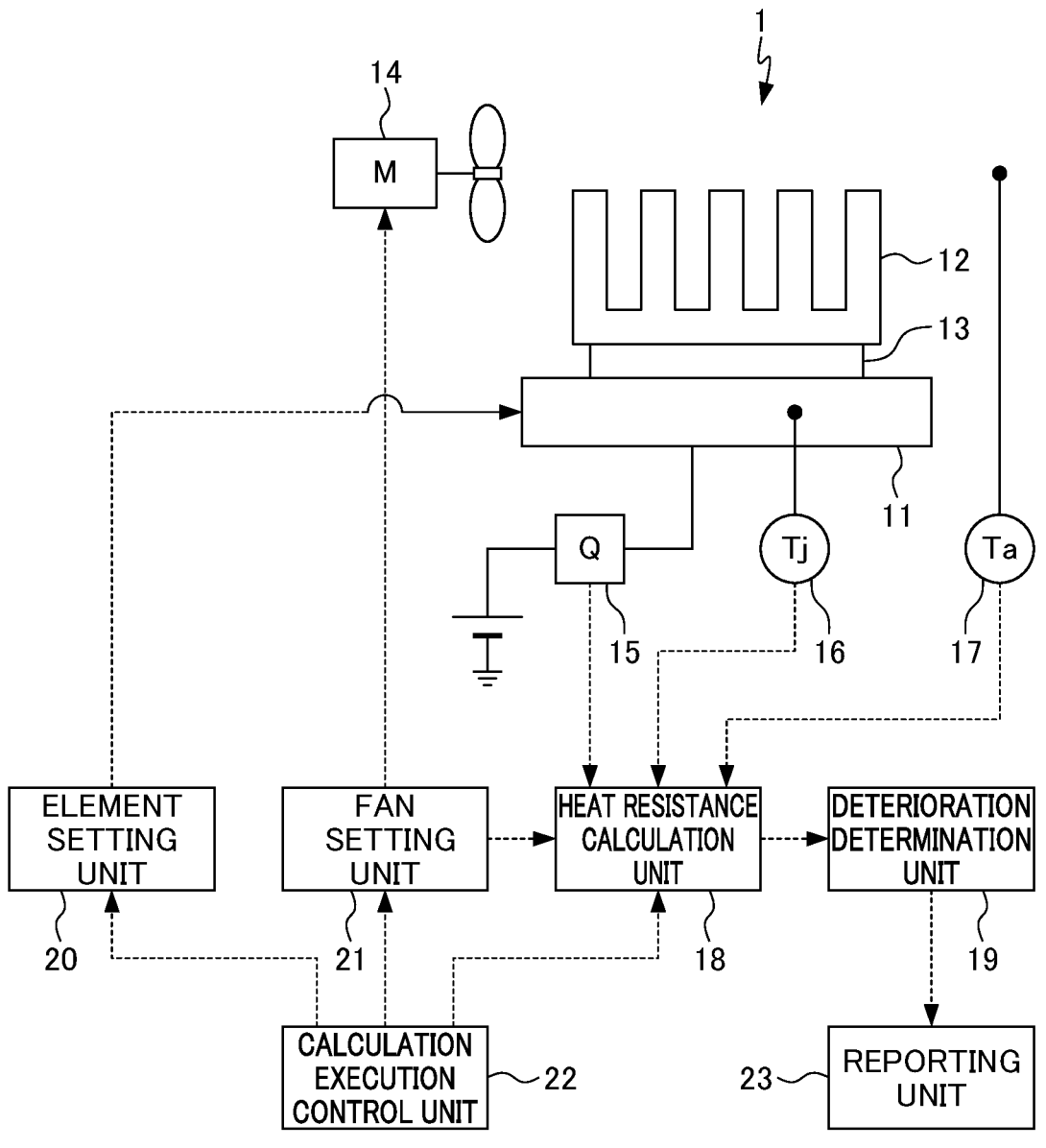

ELECTRONIC DEVICE

TECHNICAL FIELD

The present invention relates to an electronic device.

BACKGROUND ART

In electronic devices including semiconductor elements such as power semiconductors, CPUS, and the like where heat generation may be a problem, configurations have been widely adopted in which the semiconductor element is connected to a heat dissipation member such as a heat sink via a heat conductive connection body such as a heat conductive sheet to release the heat of the semiconductor element into the atmosphere. In such configurations, there is a demand for ease of deformation of the heat conductive connection body in order to increase the close contact area thereof with the semiconductor element and the heat sink, and therefore, it is not easy to reduce the heat resistance thereof compared to that of the semiconductor element and the heat sink. In order to evaluate the performance of the heat conductive connection body, the heat resistance of the heat conductive connection body may be measured in a state in which the semiconductor element and the heat dissipation member are actually connected by the heat conductive connection body (for example, see Patent Document 1).
Patent Document 1: Japanese Unexamined Patent Application, Publication No. 2006-121051

DISCLOSURE OF THE INVENTION

Problems to be Solved by the Invention

The heat conductive connection body is formed so as to be deformable in order to ensure close contact properties, and is thus likely to have more unstable physical properties compared to the semiconductor element and the heat sink. Therefore, the heat conductive connection body may deteriorate during use, leading to increased heat resistance. For example, in an electronic device used in a machine tool, cutting fluid entering the interior of the electronic device may accelerate deterioration of the heat conductive connection body. When heat conduction becomes insufficient as a result of deterioration of the heat conductive connection body, the performance of the electronic device may decrease, and malfunctioning of the semiconductor device due to thermal runaway and burnout of the semiconductor element may occur. Therefore, there is a demand for technology capable of continuously ensuring heat conduction by heat conductive connection bodies used in electronic devices.

Means for Solving the Problems

An electronic device according to one embodiment of the present disclosure includes: a semiconductor element; a heat dissipation member; a heat conductive connection body configured to connect the semiconductor element and the heat dissipation member to each other in a heat conductive manner; a power detection unit configured to detect power consumption of the semiconductor element; an element temperature detection unit configured to detect the temperature of the semiconductor element; an ambient temperature detection unit configured to detect the ambient temperature of the heat dissipation member; and a heat resistance calculation unit configured to calculate heat resistance of the heat conductive connection body on the basis of a detection value of the power detection unit, a detection value of the element temperature detection unit, and a detection value of the ambient temperature detection unit.

Effects of the Invention

According to the present embodiment, an electronic device capable of continuously ensuring heat conduction by the heat conductive connection body can be provided.

BRIEF DESCRIPTION OF THE DRAWINGS

FIG. 1 is a schematic diagram illustrating a configuration of an electronic device according to one embodiment of the present disclosure.

PREFERRED MODE FOR CARRYING OUT THE INVENTION

An embodiment of the present disclosure is described below with reference to the drawings. FIG. 1 is a schematic diagram illustrating a configuration of an electronic device 1 according to one embodiment of the present disclosure.

The electronic device 1 of FIG. 1 includes a semiconductor element 11, a heat dissipation member 12, a heat conductive connection body 13, a fan 14, a power detection unit 15, an element temperature detection unit 16, an ambient temperature detection unit 17, a heat resistance calculation unit 18, a deterioration determination unit 19, an element setting unit 20, a fan setting unit 21, a calculation execution control unit 22, and a reporting unit 23.

The semiconductor element 11 is any type of element employed in accordance with the functions of the electronic device 1, and the effects of the configuration according to the present disclosure are notable in cases where heat generation of the element may be a problem. The specific semiconductor element 11 is not particularly limited, and examples include power semiconductors such as an FET, an IGBT, or the like, and computing elements such as a CPU, an MPU, or the like. In addition, the semiconductor element 11 may be a composite element in which a plurality of semiconductors are contained in a single package.

The heat dissipation member 12 is also referred to as a heat sink, and dissipates heat into the atmosphere. The heat dissipation member 12 is formed of a material having high heat conductivity, such as copper, aluminum, or the like, and may have fins, protrusions, or the like for increasing the contact surface with the atmosphere.

The heat conductive connection body 13 connects the semiconductor element 11 and the heat dissipation member 12 to each other in a heat conductive manner. As the heat conductive connection body 13, a heat conductive sheet formed in advance in a sheet shape, or a heat conductive grease in paste form applied in layers may be used. The heat conductive connection body 13 may have an anisotropy that exhibits particularly high heat conductivity in the thickness direction thereof, that is to say, in the direction in which the semiconductor element 11 and the heat dissipation member 12 face each other.

The fan 14 forcibly ventilates the atmosphere of the heat dissipation member 12. The fan 14 is preferably provided so as to form an air current that promotes heat exchange between the heat dissipation member 12 and the atmosphere, for example, an air current in a direction that follows the fins or the like of the heat dissipation member 12.

The fan 14 is preferably driven by a motor having a controllable rotational speed. The rotational speed control of the fan 14 only needs to be capable of setting at least two rotational speeds for the fan 14 other than zero (stop), and is not limited to modes capable of exactly setting the frequency such as frequency control. For example, modes capable of roughly setting the rotational speed, such as multistage voltage control, may also be used.

The power detection unit 15 detects the power consumption of the semiconductor element 11. The power detection unit 15 may be built into the semiconductor element 11. For example, when the semiconductor element 11 is a computing element or the like, the semiconductor element generally has a configuration for detecting power consumption, and therefore a function of the semiconductor element 11 may be used as the power detection unit 15. In other words, the power detection unit 15 may be included in the semiconductor element 11.

The element temperature detection unit 16 detects the temperature of the semiconductor element 11. The element temperature detection unit 16 preferably detects the temperature in a region of the interior of the semiconductor element 11 in which a large amount of heat is generated, typically the junction temperature. The element temperature detection unit 16 may also be built into the semiconductor element 11, and a function that a computing element or the like generally has may be used.

The ambient temperature detection unit 17 detects an ambient temperature of the heat dissipation member 12. The ambient temperature of the heat dissipation member 12 may be the temperature of the air supplied to the surroundings of the heat dissipation member 12 by the fan 14, or the air directly after having moved from the surroundings of the heat dissipation member 12. The temperature of the air rises due to heat exchange with the heat dissipation member 12, but this does not constitute a major error factor so long as the temperature detection position of the ambient temperature detection unit 17 is constant, and this may be corrected by the heat resistance calculation unit 18.

The heat resistance calculation unit 18 calculates the heat resistance of the heat conductive connection body 13 on the basis of the detection value of the power detection unit 15, the detection value of the element temperature detection unit 16, and the detection value of the ambient temperature detection unit 17. When the rotational speed of the fan 14 is controlled, the heat resistance calculation unit 18 preferably calculates the heat resistance of the heat conductive connection body 13 while taking the rotational speed of the fan 14 into consideration.

When the semiconductor element 11 is a computing element, the heat resistance calculation unit 18 may be realized by causing the semiconductor element 11 to execute a suitable program, or may be realized by causing a computing element provided separately from the semiconductor element 11 to execute a suitable program. The heat resistance calculation unit 18 may be partially or entirely constituted by a physical circuit.

With the power consumption detected by the power detection unit 15 represented by Q[W], the temperature of the semiconductor element 11 detected by the element temperature detection unit 16 represented by Tj[° C.], the ambient temperature detected by the ambient temperature detection unit 17 represented by Ta[° C.], the heat resistance of the interior of the semiconductor element 11 (from the pn-junction that is the heat generating point to the package surface) represented by Re[K/W], the heat resistance of the heat dissipation member 12 represented by Rh[K/W], the heat resistance of the heat conductive connection body 13 represented by Rs[K/W], and the total heat resistance of the semiconductor element 11, the heat conductive connection body 13, and the heat dissipation member 12 represented by Rt[K/W], the relationships $Rt=Re+Rs+Rh$ and $Rt=(Tj-Ta)/Q$ are satisfied.

Further, when the rotational speed of the fan 14 is controlled, with the rotational speed of the fan 14 represented by M[rpm], the heat resistance Rh of the heat dissipation member 12 can be represented as a function F(M) of the rotational speed M of the fan 14. The function F(M) may be represented by a mathematical expression, or by a reference table in which the rotational speed M of the fan 14 and the heat resistance Rh of the heat dissipation member 12 are associated with each other. In addition, depending on the definition of the function F(M), a value of a different dimension, for example, the voltage, the electric current, the power consumption, or the like of the motor of the fan 14 may be used as the rotational speed M of the fan 14. Meanwhile, the heat resistance Re of the semiconductor 11 may be considered to be constant.

Based on the above, the heat resistance Rs of the heat conductive connection body 13 can be calculated as $Rs=Rt-(Re+Rh)=(Tj-Ta)/Q-\{Re+F(M)\}$. In particular, even when the rotational speed of the fan 14 is controlled, the heat resistance Rs of the heat conductive connection body 13 can be relatively accurately estimated by calculating the heat resistance Rh of the heat dissipation member 12 while taking the rotational speed M of the fan 14 into consideration.

The deterioration determination unit 19 determines a deterioration of the heat conductive connection body 13 by comparing the heat resistance Rs of the heat conductive connection body 13 calculated by the heat resistance calculation unit 18 with a reference value stored in advance. The deterioration determination unit 19 may be realized by another computing element that is the same as or similar to that of the heat resistance calculation unit 18, and may be partially or entirely constituted by a physical circuit. In addition, the deterioration determination unit 19 need not be clearly distinguishable from the heat resistance calculation unit 18 in terms of physical structure or program structure.

The deterioration determination unit 19 may store a plurality of reference values for classifying the degree of deterioration of the heat conductive connection body 13 into a plurality of classes, and may identify the degree of deterioration of the heat conductive connection body 13 using the class to which the heat resistance Rs of the heat conductive connection body 13 calculated by the heat resistance calculation unit 18 belongs. In addition, the deterioration determination unit 19 may predict the time until the heat resistance Rs of the heat conductive connection body 13 reaches a predetermined reference value, on the basis of a change over time of the heat resistance Rs of the heat conductive connection body 13 calculated by the heat resistance calculation unit 18.

The element setting unit 20 maintains the power consumption of the semiconductor element 11 at a value that is set in advance. In other words, the element setting unit 20 creates a steady state of heat flux by operating in a measuring mode in which the amount of heat generated by the semiconductor element 11 is fixed at a predetermined value, and thereby enables a more accurate calculation by the heat resistance calculation unit 18 of the heat resistance Rs of the heat conductive connection body 13. The element setting unit 20 may be realized by another computing element that is the same as or similar to that of the heat resistance calculation unit 18 and the deterioration determination unit 19, may be partially or entirely constituted by a physical circuit, and need not be clearly distinguishable in terms of physical structure or program structure.

The fan setting unit 21 maintains the rotational speed of the fan 14 at a set rotational speed that is set in advance. The fan setting unit 21 may be realized by another computing element that is the same as or similar to that of the heat resistance calculation unit 18, the deterioration determination unit 19, and the element setting unit 20, may be partially or entirely constituted by a physical circuit, and need not be clearly distinguishable in terms of physical structure or program structure.

When the fan setting unit 21 maintains the rotational speed of the fan 14 at a set rotational speed that is set in advance, the heat resistance calculation unit 18 preferably calculates the heat resistance Rs after the detection value of the element temperature detection unit 16 or the ambient temperature detection unit 17 has stabilized after the fan setting unit 21 has maintained the rotational speed of the fan 14 at the set rotational speed. Thus, the heat resistance Rh of the heat dissipation member 12 can be accurately calculated, which makes it possible to more accurately estimate the heat resistance Rs of the heat conductive connection body 13.

The fan setting unit 21 may maintain the rotational speed of the fan 14 at a plurality of set rotational speeds in order. In this case, the heat resistance calculation unit 18 preferably calculates the heat resistance Rs of the heat conductive connection body 13 while taking the detection values of the element temperature detection unit 16 and the ambient temperature detection unit 17 at the plurality of set rotational speeds into consideration. In other words, by having the heat resistance calculation unit 18 calculate the heat resistance Rs of the heat conductive connection body 13 under a plurality of conditions in which the rotational speed of the fan 14 differs, the heat resistance Rs of the heat conductive connection body 13 can be more accurately estimated.

The calculation execution control unit 22 causes the calculation of the heat resistance by the heat resistance calculation unit 18 to be executed when the electronic device 1 is not operating. The calculation execution control unit 22 may be realized by another computing element that is the same as or similar to that of the heat resistance calculation unit 18, the deterioration determination unit 19, the element setting unit 20, and the fan setting unit 21, may be partially or entirely constituted by a physical circuit, and need not be clearly distinguishable in terms of physical structure or program structure.

As an example, the calculation execution control unit 22 may cause the heat resistance calculation unit 18 to calculate the heat resistance Rs of the heat conductive connection body 13 as a part of a process for stopping the electronic device 1. Thus, the heat resistance Rs of the heat conductive connection body 13 can be accurately calculated in a state in which there is no variation in power consumption of the semiconductor element 11 due to the operation of the electronic device 1.

In order to more accurately calculate the heat resistance Rs, the calculation execution unit 22 prepares for the calculation of the heat resistance by the heat resistance calculation unit 18, by causing the setting of the power consumption of the semiconductor element 11 by the element setting unit 20 and the setting of the rotational speed of the fan 14 by the fan setting unit 21 to be executed, and the heat resistance calculation unit 18 calculates the heat resistance Rs of the heat conductive connection body 13 on the basis of the detection values of the power detection unit 15 and the element temperature detection unit 16 after reaching the steady state, whereby the heat resistance Rs of the heat conductive connection body 13 can be accurately estimated. This makes it possible for the deterioration determination unit 19 to accurately identify the deterioration state of the heat conductive connection body 13. In other words, the electronic device 1 continuously ensures the heat conduction of the heat conductive connection body 13, that is to say the heat conduction from the semiconductor element 11 to the heat dissipation member 12. This makes the electronic device 1 capable of avoiding unexpected thermal runaway and burnout or the like of the semiconductor element 11 caused by heat dissipation failure.

The reporting unit 23 reports the determination result determined by the deterioration determination unit 19. The reporting unit 23 may be realized by another computing element that is the same as or similar to that of the heat resistance calculation unit 18, the deterioration determination unit 19, the element setting unit 20, the fan setting unit 21, and the calculation execution control unit 22, may be partially or entirely constituted by a physical circuit, and need not be clearly distinguishable in terms of physical structure or program structure.

A report by the reporting unit 23 may directly notify a user of the determination result by a visual signal, an audio signal, or the like, or may output a signal indicating the determination result to another device. The report by the reporting unit 23 may be performed only when the determination result determined by the deterioration determination unit 19 is a predetermined result, for example, when the degree of deterioration is deemed to be equal to or more than a certain degree.

An embodiment of the present disclosure has been described above, but the present invention is not limited to this embodiment. In addition, the effects of the embodiment described above are merely examples of most preferred effects, and the effects of the present invention are not limited to the ones described in the above embodiment.

As an example, in the electronic device according to the present invention, the fan, the deterioration determination unit, the element setting unit, the fan setting unit, the calculation execution control unit, and the reporting unit may be omitted.

EXPLANATION OF REFERENCE NUMERALS

1 Electronic device
11 Semiconductor element
12 Heat dissipation member
13 Heat conductive connection body
14 Fan
15 Power detection unit
16 Element temperature detection unit
17 Ambient temperature detection unit
18 Heat resistance calculation unit
19 Deterioration determination unit
20 Element setting unit
21 Fan setting unit
22 Calculation execution control unit
23 Reporting unit

The invention claimed is:
1. An electronic device comprising:
a semiconductor element;
a heat dissipation member;
a heat conductive connection body configured to connect the semiconductor element and the heat dissipation member to each other in a heat conductive manner;

7 a power detection unit configured to detect power consumption of the semiconductor element;

an element temperature detection unit configured to detect a temperature of the semiconductor element;

an ambient temperature detection unit configured to detect an ambient temperature of the heat dissipation member;

a heat resistance calculation unit configured to calculate a heat resistance of the heat conductive connection body on the basis of a detection value of the power detection unit, a detection value of the element temperature detection unit, and a detection value of the ambient temperature detection unit;

a fan for forcibly ventilating an atmosphere of the heat dissipation member; and a fan setting unit configured to maintain the rotational speed of the fan at a set rotational speed that is set in advance; wherein the heat resistance calculation unit calculates the heat resistance after the detection value of the element temperature detection unit or the ambient temperature detection unit has stabilized after the fan setting unit has maintained the rotational speed of the fan at the set rotational speed; and the heat resistance calculation unit calculates the heat resistance while taking a rotational speed of the fan into consideration.

2. The electronic device according to claim 1, further comprising a deterioration determination unit configured to determine a deterioration of the heat conductive connection body by comparing the heat resistance calculated by the heat resistance calculation unit with a reference value.

3. The electronic device according to claim 1, further comprising an element setting unit configured to maintain the power consumption of the semiconductor element at a value that is set in advance.

4. The electronic device according to claim 1, wherein the fan setting unit maintains the rotational speed of the fan at a plurality of the set rotational speeds in order, and the heat resistance calculation unit calculates the heat resistance while taking the detection values of the element temperature detection unit and the ambient temperature detection unit at the plurality of set rotational speeds into consideration.

5. An electronic device comprising:

a semiconductor element;

a heat dissipation member;

a heat conductive connection body configured to connect the semiconductor element and the heat dissipation member to each other in a heat conductive manner;

a power detection unit configured to detect power consumption of the semiconductor element;

an element temperature detection unit configured to detect a temperature of the semiconductor element;

an ambient temperature detection unit configured to detect an ambient temperature of the heat dissipation member;

a heat resistance calculation unit configured to calculate a heat resistance of the heat conductive connection body on the basis of a detection value of the power detection unit, a detection value of the element temperature detection unit, and a detection value of the ambient temperature detection unit; and a calculation execution control unit configured to cause the calculation of the heat resistance by the heat resistance calculation unit to be executed when the electronic device is not operating.

* * * * *